United States Patent
Hoang et al.

(10) Patent No.: US 7,619,451 B1
(45) Date of Patent: Nov. 17, 2009

(54) TECHNIQUES FOR COMPENSATING DELAYS IN CLOCK SIGNALS ON INTEGRATED CIRCUITS

(75) Inventors: Tim Tri Hoang, San Jose, CA (US); Sergey Shumarayev, Los Altos Hills, CA (US); Kazi Asaduzzaman, Fremont, CA (US); Wanli Chang, Saratoga, CA (US); Mian Z. Smith, Los Altos, CA (US); Kang-Wei Lai, Milpitas, CA (US); Leon Zheng, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 56 days.

(21) Appl. No.: 11/670,971

(22) Filed: Feb. 3, 2007

(51) Int. Cl.
*H03L 7/06* (2006.01)

(52) U.S. Cl. ................... 327/156; 327/146; 327/147; 327/155; 327/163

(58) Field of Classification Search ......... 327/146–150, 327/155–159, 163
See application file for complete search history.

(56) References Cited

U.S. PATENT DOCUMENTS

| | | | |
|---|---|---|---|
| 6,140,854 A * | 10/2000 | Coddington et al. | 327/158 |
| 6,194,930 B1 * | 2/2001 | Matsuzaki et al. | 327/156 |
| 6,259,288 B1 * | 7/2001 | Nishimura | 327/156 |
| 6,791,381 B2 * | 9/2004 | Stubbs et al. | 327/156 |
| 7,071,743 B2 * | 7/2006 | Starr | 327/147 |
| 7,098,707 B2 * | 8/2006 | Starr et al. | 327/147 |
| 7,248,091 B2 * | 7/2007 | Chung | 327/262 |
| 7,471,130 B2 * | 12/2008 | Gomm et al. | 327/158 |
| 2005/0242850 A1 * | 11/2005 | Kawasaki | 327/155 |
| 2006/0044033 A1 * | 3/2006 | Kim | 327/158 |

OTHER PUBLICATIONS

"PLLs in Sratix II & Stratix II GX Devices," Altera Corporation, Dec. 2005, pp. 5-1, 5-7, 5-15, 5-19 thru 5-24.

* cited by examiner

*Primary Examiner*—Lincoln Donovan
*Assistant Examiner*—Patrick O'Neill
(74) *Attorney, Agent, or Firm*—Steven J. Cahill

(57) ABSTRACT

Techniques are provided for compensating for phase and timing delays in clock signals generated by phase-locked loops and delay-locked loops on integrated circuits. Circuit elements coupled in a feedback loop of a locked circuit can compensate for the timing and phase delays between an input pin and an output pin. Other circuit elements coupled in the feedback loop of a locked circuit can compensate for the delay between an input pin and a destination circuit element. Still other circuit elements coupled in an input reference path of a locked circuit preserve a timing relationship between input clock and input data signals. A clock signal and a data signal received at a destination circuit element have the same phase and timing relationship that exists between the input clock and input data signals at input pins.

23 Claims, 10 Drawing Sheets

TECHNIQUES FOR COMPENSATING DELAYS IN CLOCK SIGNALS ON INTEGRATED CIRCUITS

BACKGROUND OF THE INVENTION

The present invention relates to electronic circuits, and more particularly, to clock compensation circuits.

A phase locked-loop (PLL) is a circuit that regenerates and reconditions an input clock signal for use inside an integrated circuit. A PLL can also be used to re-broadcast clock signals over a long trace. In addition, a PLL can multiply an input clock signal by a scaled factor that reduces the need to send a high speed clock in the system. A PLL can also eliminate skew in a clock signal.

In many integrated circuit (IC) chips, an output clock signal of a PLL is transmitted through a clock routing network before reaching a destination circuit on the IC chip. A long clock routing network can introduce significant phase and timing delays into an output clock signal of a PLL. Many applications would benefit from techniques that reduce phase and timing delays in clock signals on an IC.

BRIEF SUMMARY OF THE INVENTION

The present invention provides techniques that compensate for phase and timing delays in clock signals on integrated circuits. The techniques of present invention can be used to compensate clock signals that are provided to or generated by phase-locked loops (PLLs) and delay-locked loops (DLLs). PLLs and DLLs are also referred to herein as locked circuits.

According to some embodiments of the present invention, circuit elements coupled in a feedback loop of a locked circuit compensate for the delay in a clock signal between an input pin and an output pin. According to other embodiments, circuit elements coupled in the feedback loop of a locked circuit compensate for the delay in a clock signal between an input pin and a destination circuit element.

According to still other embodiments of the present invention, circuit elements coupled in an input reference path of a locked circuit preserve a timing relationship between input clock and input data signals. A clock signal and a data signal received at a destination circuit element have the same phase and timing relationship that exists between the input clock and input data signals at input pins.

Other objects, features, and advantages of the present invention will become apparent upon consideration of the following detailed description and the accompanying drawings.

DETAILED DESCRIPTION OF THE INVENTION

Figure 1:
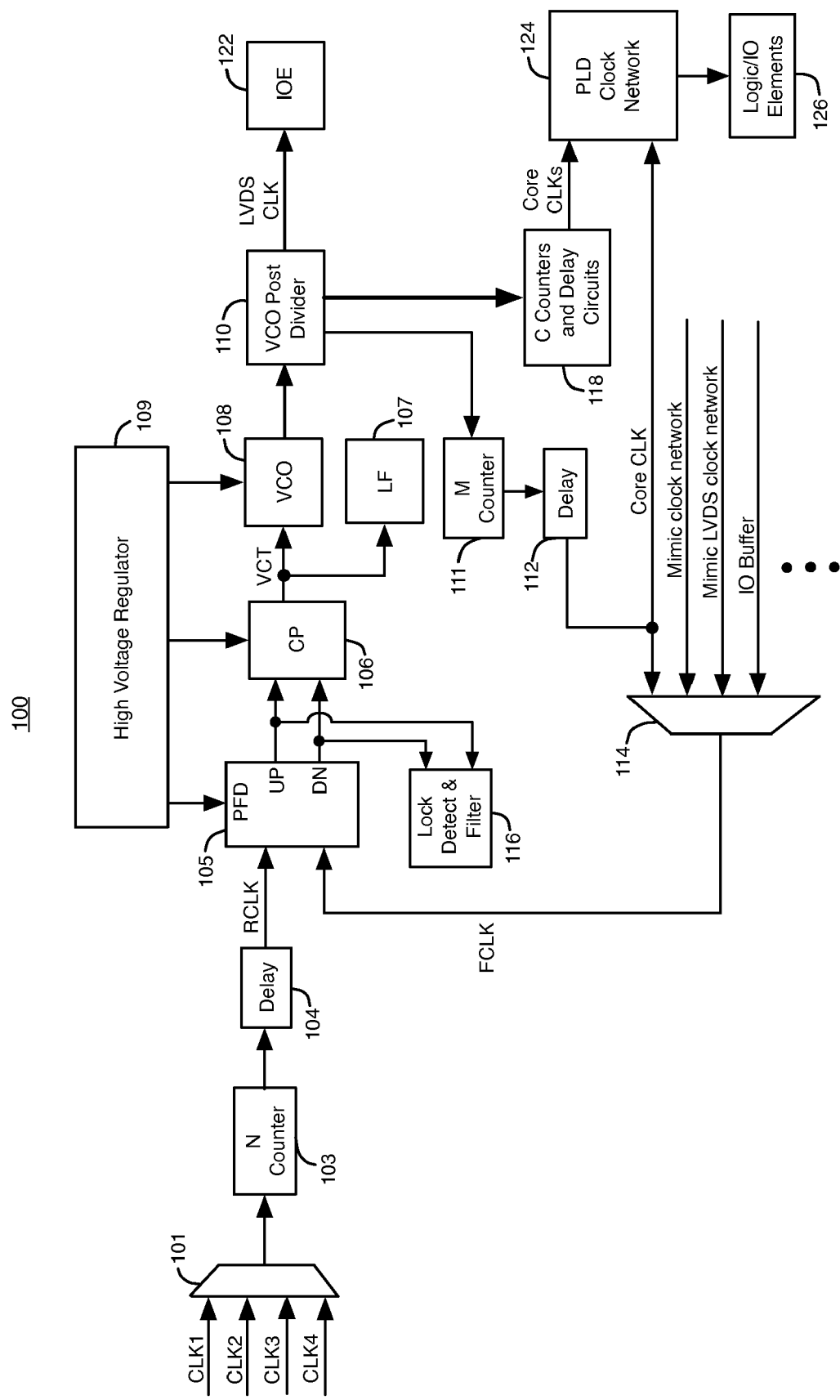
FIG. 1 illustrates a phase-locked loop circuit that can generate a compensated output clock signal, according to an embodiment of the present invention.

FIG. 1 illustrates a phase-locked loop (PLL) circuit 100 that can generate a compensated output clock signal, according to an embodiment of the present invention. PLL 100 is located on a programmable logic device PLD. PLDs are also referred to as field programmable gate arrays (FPGAs). PLL 100 is merely one example of a PLL that can include embodiments of the present invention. It should be understood that embodiments of the present invention can be used with PLLs having numerous other configurations.

PLL 100 includes an input clock multiplexer 101, N counter circuit 103, delay circuit 104, phase and frequency detector (PFD) 105, charge-pump (CP) 106, loop filter (LF) 107, voltage controlled oscillator (VCO) 108, high voltage regulator 109, VCO post-divider circuit 110, feedback M clock counter circuit 111, delay circuit 112, multiplexer 114, lock detect and filter 116, and core-clock (C) counter circuits and delay circuits 118.

Input clock multiplexer 101 receives 4 (or more) dedicated differential or single-ended input clock signals, CLK1, CLK2, CLK3, and CLK4. The received clock signals can include, for example, one sneak clock signal from the core of the programmable logic device (PLD), one clock signal from an adjacent PLL output that allows a user to cascade 2 PLLs in order to generate odd frequencies by using different combinations of the C, N, and M counters in the second PLL, and a clock signal driven from an input pin.

Multiplexer 101 selects one of the input clock signals. The selected clock signal is transmitted to N counter circuit 103. Counter circuit 103 is used to divide the frequency of the input clock signal from multiplexer 101. N counter 103 can, for example, support up to 256 different frequency division settings, from divide-by-1 up to divide-by-256. N counter 103 reduces the need for PFD 105 to operate at its maximum reference clock signal speed. N counter 103 also gives multiple PLL blocks in the integrated circuit the flexibility to be trained by the same reference clock source. This feature enables the device to support independent channel operation.

Delay circuit 104 delays the output signal of counter 103 to generate a periodic reference clock signal RCLK at a first input of PFD 105. The delay of delay circuit 104 can be programmed to correct overcompensation in the feedback path of PLL 100 or to compensate for variations in the delay of counters 103, 111, and 118. PFD 105 compares the phase and the frequency of the RCLK reference clock signal and a VCO feedback clock signal FCLK to determine if the two clock signal are aligned in phase and have the same frequency. PFD 105 generates control signals at UP and DN outputs in response to the differences in the phases and frequencies of RCLK and FCLK. PFD 105 generates control signals at UP and DN outputs in response to the differences in the phases and frequencies of RCLK and FCLK. To minimize phase error and dead zone when PLL 100 is in lock, minimum pulses are generated at the UP and DN outputs. PFD 105 is optimized to support the maximum reference clock frequency.

The UP and DN outputs of PFD 105 are coupled to inputs of charge pump (CP) 106. CP 106 generates a voltage control signal VCT that is filtered by loop filter 107. Voltage controlled oscillator (VCO) 108 typically generates multiple periodic (clock) output signals. VCO 108 varies the frequencies of its output clocks signals in response to control voltage VCT. Loop filter 107 has a fixed capacitance large capacitor. Loop filter 107 also has programmable capacitors and programmable resistors that can be programmed to meet different bandwidth requirements and to provide loop stability.

If feedback signal FCLK is lagging behind RCLK, PFD 105 sets the signal at the UP output high. CP block 106 charges a capacitor in loop filter 107 in response to high signals from the UP output of PFD 105. As a result, control signal VCT increases, causing the frequencies of the VCO output clock signals to increase. On the other hand, if control signal FCLK is leading RCLK, PFD 105 sets the signal at the DN output to high. CP 106 discharges the capacitor in loop filter 107 in response to high signals from the DN output of PDF 105. As a result, control signal VCT decreases, causing the frequencies the VCO output clock signals to decrease.

Voltage controlled oscillator (VCO) block 108 can be, for example, a 4-stage, differential ring, voltage-control oscillator having cross-coupled pairs of NMOS field-effect transistors. Alternatively, numerous other types of VCOs can be used in PLLs of the present invention.

The VCO output signals are level-shifted to the supply voltage of the counter circuits (e.g., 1.2 volts), before they are transmitted to counters 111 and 118. VCO 108 can, for example, generate 8 periodic clock signals having 8 equally spaced 45 degree phase shifts. These output periodic clock signals are used to drive various protocols, such as a memory interface.

CP 106 can include a unity gain operational amplifier (op-amp) that compensates for the charge loss on switching nodes caused by charge sharing. The op-amp ensures that voltages on these nodes quickly recover back to the VCO control voltage (VCT) before the next switching activity. The op-amp helps to control the amount of charge delivered to and removed from the loop filter 107.

An active compensated regulator 109 provides regulated power supply voltages to PFD 105, CP 106, and VCO 108. Active compensated regulator 109 is designed to improve the power supply noise rejection ratio as small as −40 dB. Any switching noise from the power supply is filtered out before it reaches PFD 105, CP 106, and VCO 108.

The periodic output clock signals of VCO 108 are transmitted to VCO post divider block 110. VCO post divider block 110 can be programmed to divide the frequencies of the VCO output signals. For example, VCO post-divider block 110 can have three settings. The three settings are bypass, divide-by-2, and divide-by-4. In bypass mode, VCO post divider 110 does not divide the frequencies of the VCO output clock signals. In divide-by-2 mode, VCO post divider 110 divides the frequencies of the VCO output clock signals by 2. In divide-by-4 mode, VCO post divider 110 divides the frequencies of the VCO output clock signals by 4.

VCO post divider 110 can, for example, extend the tuning range of PLL 100 from below 300 MHz up to 1.3 GHz. VCO post divider 110 can also improve the performance of VCO 108. Post divider 110 generates an output clock signal (LVDS CLK) for low voltage differential signaling (LVDS) input/output signals. The LVDS CLK signal is transmitted to input/output element (IOE) 122 and other IOEs on the chip. VCO post divider 110 can also be used as a central divider for all SERDES channels in a field programmable gate array (FPGA) IC, instead of having individual divider circuits for each channel, which can cause more clock skew among the channels.

VCO post divider 110 transmits another periodic output signal to feedback counter M 111. Counter 111 divides frequency of the periodic output signal from VCO post divider 110 by a division ratio M to generate a periodic output signal. M counter 111 supports up to 256 division ratio settings.

M counter 111 also has the capability to vary the duty-cycle of its periodic output signal. Counter 111 allows a user to change the duty cycle of its output signal from 5% up to 50% to satisfy different interfaces. The frequency of the periodic output signal of M counter 111 equals the frequency of RCLK at PFD 105 when PLL 100 is in lock.

The periodic output signal of M counter 111 is delayed by a programmable delay circuit 112 and then transmitted to an input of multiplexer 114. Delay circuit 112 can be programmed to delay the periodic output signal of counter 111 to compensate for variations in the delays of counter 111 and the counters in block 118. Delay circuit 112 can also be used to compensate for any mismatch between the reference clock path and the feedback clock path. Multiplexer 114 can be programmed to transmit the periodic output signal of delay circuit 112 to a second input of PFD 105 as the feedback signal FCLK in a non-compensation mode.

In the non-compensation mode, delays in the input and output clock signals of PLL 100 are not compensated for. Instead, the delay in the feedback signal FCLK is minimized in the non-compensation mode by coupling a feedback path from VCO 108 through VCO post divider 110, counter 111, delay circuit 112, and multiplexer 114 to PFD 105. The output signals of PLL 100 have optimal jitter performance characteristics in the non-compensation mode, because the delay in the feedback path is minimized. Non-compensation mode is useful for applications on an integrated circuit that do not require a particular phase or timing relationship between a PLL output signal and another signal, e.g., an application that only needs to perform a frequency synthesis function.

Multiplexer 114 can also be programmed to transmit a signal from a mimic clock network, from a mimic LVDS clock network, from an IO buffer, or from another source on the integrated circuit to the second input of PFD 105 as the feedback signal FCLK. The clock compensation networks are described in further detail below.

Core (C) counter block 118 has multiple counter circuits that receive multiple periodic output signals from VCO post divider 110. Counters 118 divide the frequencies of the periodic output signals from VCO post divider 110 to generate multiple core clock signals. The core clock signals are transmitted to programmable logic and input/output (IO) elements 126 in a programmable logic device (PLD) through PLD clock network 124. The output signals of counters 118 can also be used to train a delay-locked loop on the IC.

Block 118 supports up to 256 frequency divider ratio settings. Counter 118 can vary the duty cycle of its core clock output signals in response to programmable bits. When VCO post divider 110 is in bypass mode and PLL 100 is in lock, the frequencies at the outputs of VCO post divider 110 equal the input frequency of the signal selected by multiplexer 101 times M/N, where N is the frequency division ratio counter 103, and M is the frequency division ratio of counter 111. The frequency of the output signal of one of the counters in block 118 equals the input frequency of the signal selected by multiplexer 101 times M/(N*C), where C equals the frequency division ratio of the counter in block 118, and VCO post divider 110 is in bypass mode.

PLL 100 can have, e.g., up to 11 counter circuits in block 118. Adding more counters in block 118 provides more flexibility for a programmable logic device to generate multiple clock frequencies to support different protocols and memory interfaces and to reach multiple destinations on the chip with independent frequencies. The counter settings for the frequency divider ratios in counter 103, counter 111, counters 118, and VCO post divider 110 are set based on desired output clock frequencies that designers target to. Block 118 also includes programmable delay blocks that can delay the output signals of the counter circuits by programmable delays to compensate for any offsets in the counter circuits.

Two inputs of lock detect and filter circuit block 116 are coupled to the UP and DN outputs of PFD 105. Block 116 generates a Lock signal when the frequencies of RCLK and FCLK are the same (i.e., in lock). Block 116 also prevents PLL 100 from accidentally going in and out of lock mode. In addition to the lock detect feature, block 116 includes a digital lock filter that prevents the Lock signal from changing states too often. The lock filter can be used in conjunction with reset-upon-loss-of-lock features. If this option is activated, PLL 100 automatically resets itself, if it becomes un-locked.

The charge pump current 106, the gain of VCO 108 (KVCO), the frequency divider ratios N/M/C of counters 103/111/118, and the resistance and capacitance in loop filter 107 are carefully selected based on protocols, specifications, and user input frequencies to ensure that PLL 100 provides optimum performance, low jitter, and stability.

Figure 2:
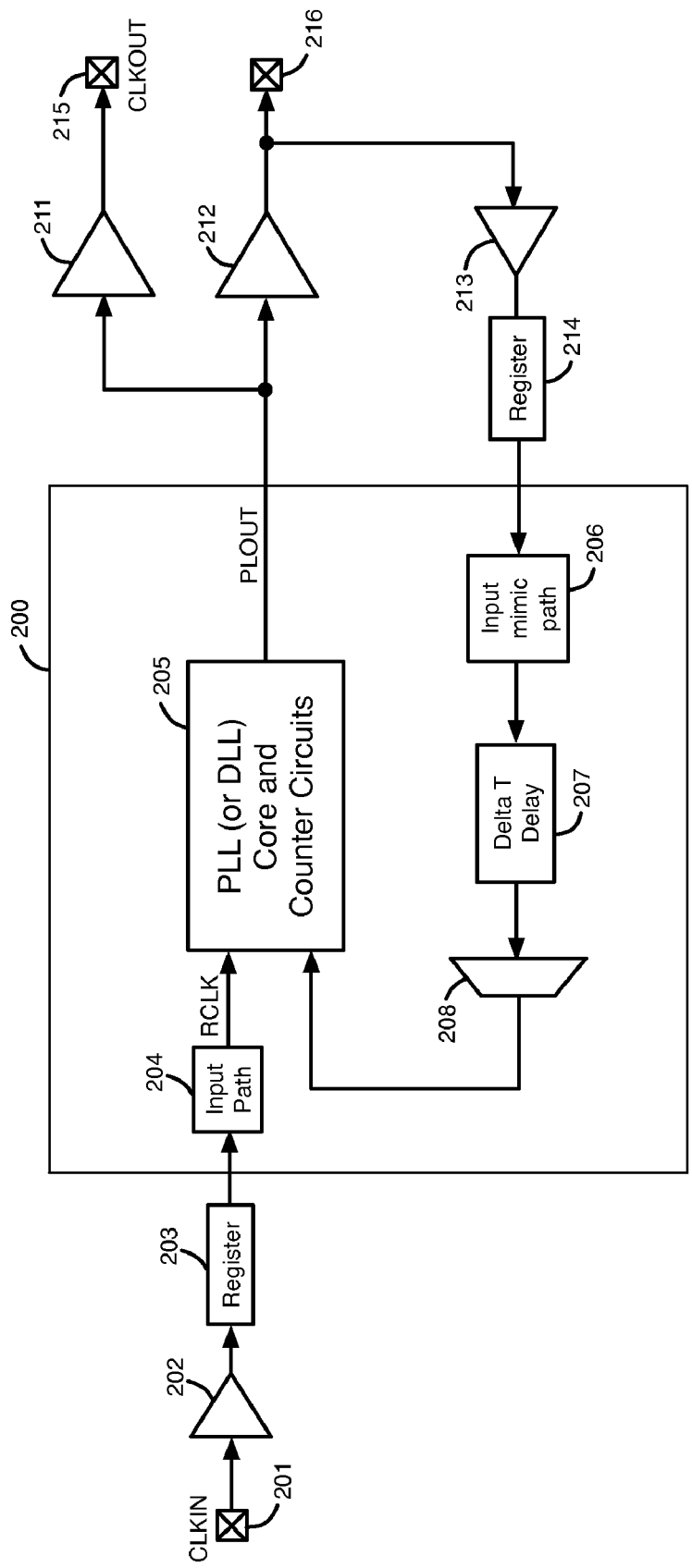
FIG. 2 illustrates circuitry that compensates for the delay between a clock input pin and a clock output pin, according to an embodiment of the present invention.

FIG. 2 illustrates circuitry that compensates for the delay between a clock input pin and a clock output pin on an IC, according to an embodiment of the present invention. The compensation circuitry of FIG. 2 generates a clock signal CLKOUT at a clock output pin 215 that has zero delay relative to a clock input signal CLKIN received at a clock input pin 201. The compensation circuitry of FIG. 2 generates a mode of operation that is referred to as zero delay buffer mode.

A phase-locked loop (PLL) 200 is shown in FIG. 2. PLL 200 is located on a programmable logic integrated circuit (IC), such as a PLD or an FPGA. Input buffer 202 drives clock signal CLKIN from input pin 201 to input/output (IO) register 203. Programmable logic connections (not shown) can be programmed to transmit input clock signal CLKIN from IO register 203 to an input of PLL 200.

PLL 200 includes input path circuitry 204 and PLL core and counter circuits 205. Input path circuitry 204 includes multiplexer 101, counter 103, delay circuit 104, and possibly other circuit elements (e.g., a decoder) that are not shown in FIG. 1. PLL core and counter circuits 205 include circuit elements 105-112, 114, 116, and 118 shown in FIG. 1. Multiplexer 101 can be programmed to transmit the output signal of register 203 to a first input of PFD 105 as shown in FIG. 1. Input buffer 202, register 203, and input path circuitry 204 introduce a delay between the edges of RCLK and corresponding edges of CLKIN.

As discussed above, VCO 108 generates multiple periodic output signals. The frequencies of the periodic output signals of VCO 108 are divided by VCO post divider 110, M counter 111, and C counter circuits in block 118. The output signals of block 118 can be transmitted outside of PLL 200.

One of the periodic output signals PLOUT of block 118 is transmitted to inputs of output buffers 211 and 212 as shown in FIG. 2. Output buffer 211 drives output signal PLOUT to pin 215 as output clock signal CLKOUT. Output clock signal CLKOUT is driven from output pin 215 to one or more circuit elements that are external to the integrated circuit.

Output buffer 212 drives PLOUT to output pin 216. Output buffer 212 introduces the same delay or approximately the same delay into output signal PLOUT as output buffer 211. Output buffer 212 is a dummy buffer that is placed into the feedback path of PLL 200 to compensate for the delay of output buffer 211. Output buffer 212 is a mimic of output buffer 211.

If output buffer 212 contains the same or substantially the same circuit architecture as output buffer 211, the delays of output buffers 211 and 212 vary by the same amount in response to process, voltage, and temperature variations on the integrated circuit.

Input buffer 213 drives the output clock signal PLOUT from the output of output buffer 212 to PLL 200 through IO register 214, as shown in FIG. 2. Input buffer 213 has the same or approximately the same delay as input buffer 202. Input buffer 213 is a dummy buffer that is placed into the feedback path of PLL 200 to compensate for the delay that input buffer 202 introduces into the input reference path of PLL 200. Input buffer 213 is a mimic of input buffer 202. Placing output buffer 212 and input buffer 213 into the feedback path of PLL 200 causes the phase and timing of clock signal CLKOUT at output pin 215 to match the phase and timing of clock signal CLKIN at input pin 201.

If input buffer 213 contains the same or substantially the same circuit architecture as input buffer 202, the delays of input buffers 202 and 213 vary by the same amount in response to process, voltage, and temperature variations on the integrated circuit.

PLL 200 also includes input mimic path circuitry 206, delta T delay circuitry 207, and multiplexer 208. Input mimic path circuitry 206, delta T delay circuitry 207, and multiplexer 208 are placed into the feedback loop of PLL 200 to compensate for other delays in the input reference path and the feedback path of PLL 200, as will now be described.

The output signal of register 214 is driven to an input of input mimic path circuitry 206 inside PLL 200. Input mimic path circuitry 206 delays the output signal of register 214 by a delay that equals or approximates the delay of input path circuitry 204.

Input mimic path circuitry 206 is designed to compensate for the delay that input path 204 introduces into reference clock signal RCLK. Input mimic path circuitry 206 can, for example, include the same circuitry that is in input path 204. Alternatively, input mimic path circuitry 206 can have a set of delay circuits that have the same, or approximately the same, delay as input path 204.

The output signal of input mimic path circuitry 206 is transmitted to an input of delta period (T) delay circuitry 207. Delta T delay circuitry 207 delays the output signal of input mimic path circuitry 206 by a programmable or fixed delay. Delta T delay circuitry 207 can compensate for any mismatches between the input reference path and the feedback path of PLL 200. For example, the delay of delta T delay circuitry 207 can compensate for any extra delay between register 203 and PLL core circuitry 205 that is not compensated for by input mimic path circuitry 206.

Buffers 202 and 211-213 can drive single-ended or differential signals. Also, buffers 202 and 211-213 can use a variety of input/output standards. For example, input buffer 213 may be hardwired to a specific input/output (I/O) standard that is different than that the I/O standard used in input buffer 202. If input buffers 202 and 213 use different I/O standards, the two input buffers may have different delays. Also, process variations, layout variations, and load differences can cause the delay of input buffer 213 to be different than the delay of input buffer 202. The delay of delta T delay circuitry 207 can be set to compensate for any differences in the delays of input buffer 202 and input buffer 213.

Output buffer 212 can have a different delay than output buffer 211 if the two output buffers use different I/O standards. For example, output buffer 212 may be hardwired to a specific input/output (I/O) standard that is different than that the I/O standard used in output buffer 211. If output buffers 211 and 212 use different I/O standards, the two output buffers may have different delays. Also, process variations, layout variations, and load differences can cause the delay of buffer 212 to be different than the delay of buffer 211. The delay of delta T delay circuitry 207 can be set to compensate for any differences in the delays of output buffers 211 and 212. Delta T delay circuitry 207 can, for example, have delay circuits that can be programmed to have any delay up to a maximum delay (e.g., 3 nanoseconds).

Multiplexer 208 is programmed to transmit the output signal of delta T delay circuitry 207 to an input of multiplexer 114, shown in FIG. 1. In zero delay buffer mode, multiplexer 114 is programmed to select the output signal of multiplexer 208 for transmission to the second input of PFD 105 as the feedback signal FCLK. The compensation circuitry of FIG. 2 lines up the edges of clock output signal CLKOUT at pin 215 with corresponding edges of clock input signal CLKIN at pin 201 so that there is zero delay between the two signals. As a result, the compensation circuitry of FIG. 2 causes the clock output signal received at pin 215 to have the same phase and timing as clock signal CLKIN at pin 201.

Figure 3:
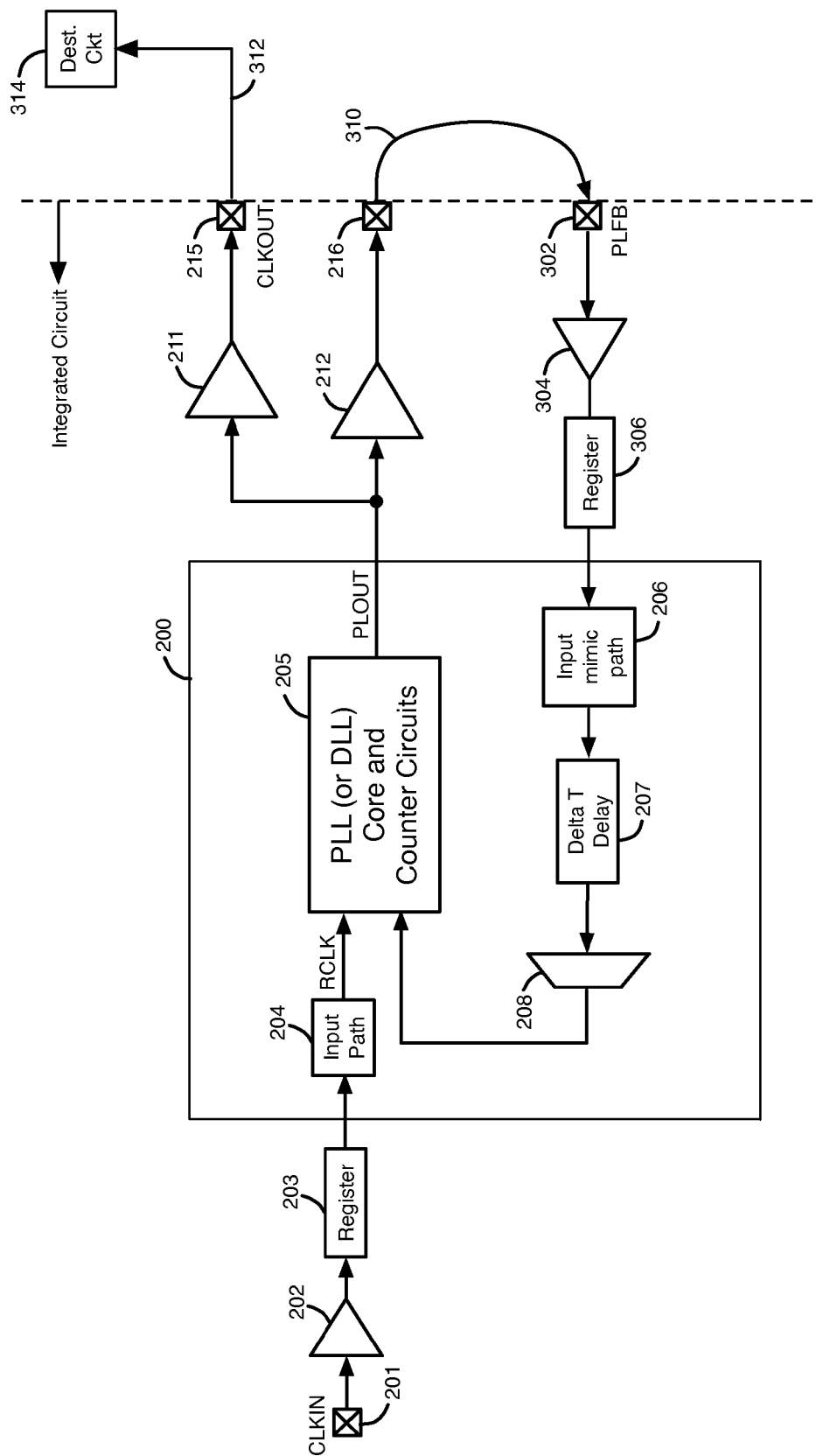
FIG. 3 illustrates circuitry that compensates for trace delay in a circuit board, according to an embodiment of the present invention.

FIG. 3 illustrates circuitry that compensates for the trace delay in a circuit board, according to an embodiment of the present invention. The compensation circuitry of FIG. 3 causes a clock signal that is driven to an external destination circuit to have the same phase and timing as an input clock signal received at an input pin. The compensation circuitry of FIG. 3 generates a mode of operation that is referred to as external feedback mode.

Phase-locked loop (PLL) 200 is shown in FIG. 2. As described above, input buffer 202 drives clock signal CLKIN from input pin 201 to PLL 200 through register 203. PLL 200 includes input path circuitry 204, PLL core and counter circuits 205, input mimic path circuitry 206, delta T delay circuitry 207, and multiplexer 208, which are described above.

A periodic output signal PLOUT of PLL 200 is driven from one of the C counters of block 118 in FIG. 1 to inputs of output buffers 211 and 212. Output buffer 211 drives an output clock signal CLKOUT to an input of destination circuit 314 through clock output pin 215 and board trace 312. Board trace 312 and destination circuit 314 are located outside the IC that contains PLL 200. Board trace 312 introduces a delay into CLKOUT between pin 215 and the input of destination circuit 314.

Output buffer 212 drives signal PLOUT to clock output pin 216. Output buffer 212 has the same or approximately the same delay as output buffer 211. Output buffer 212 compensates for the delay of output buffer 211, as described above.

The signal at clock output pin 216 is transmitted through a board trace 310 to feedback input pin 302. Board trace 310 is located outside the integrated circuit that contains PLL 200. Board trace 310 has the same or approximately the same delay as board trace 312. For example, board trace 310 can be the same length as board trace 312. Board trace 310 is placed in the feedback loop of PLL 200 to compensate for the delay of board trace 312.

Input buffer 304 drives signal PLFB at feedback input pin 302 to PLL 200 through register 306. Input buffer 304 is placed in the feedback loop of PLL 200 to compensate for the delay of input buffer 202. The output signal of register 306 is transmitted to an input of input mimic path circuitry 206. Multiplexer 208 is programmed to transmit the output signal of delta T delay circuitry 207 to an input of multiplexer 114 in FIG. 1.

In external feedback mode, multiplexer 114 is programmed to select the output signal of multiplexer 208 for transmission to the second input of PFD 105 as the feedback signal FCLK. In external feedback mode, the edges of the output clock signal at the input of destination circuit 314 occur at the same time as corresponding edges of CLKIN at pin 201. As a result, the compensation circuitry of FIG. 3 causes the clock output signal received at circuit 314 to have the same phase and timing as clock signal CLKIN at pin 201.

Figure 4:
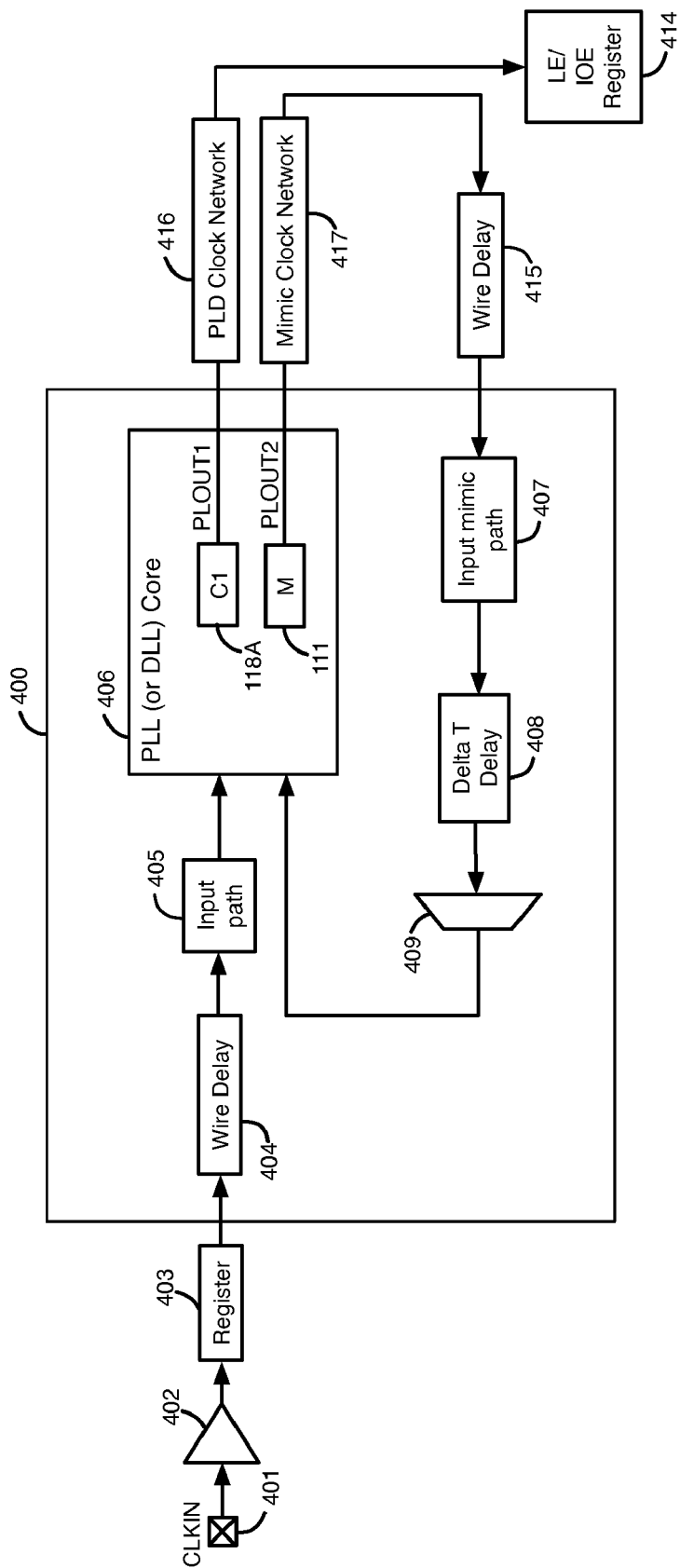
FIG. 4 illustrates circuitry that compensates for the delay between a clock input pin and a destination circuit element on an integrated circuit, according to an embodiment of the present invention.

FIG. 4 illustrates circuitry that compensates for the delay between a clock input pin and a destination circuit element on an integrated circuit, according to an embodiment of the present invention. The phase-locked loop (PLL) 400 of FIG. 4 can generate a clock signal at a circuit element (e.g., a register) on an integrated circuit that has the same phase and timing as a clock signal received at a clock input pin. The circuitry of FIG. 4 generates a mode of operation that is referred to as normal mode.

PLL 400 is located on a programmable logic device (PLD) integrated circuit. PLDs are also referred to as field programmable gate arrays (FPGAs). The PLD receives an input clock signal CLKIN at an input clock pin 401. Clock pin 401 is coupled to an input of input buffer 402. Input buffer 402 can be single-ended or differential. Input buffer 402 drives clock signal CLKIN to IO register 403. Programmable logic connections (not shown) on the PLD can be programmed to route clock signal CLKIN from register 403 to an input of PLL 400. CLKIN is routed from register 403 through wire delay 404 and input path circuitry 405 to a first input of PFD 105 in PLL core 406 as reference clock signal RCLK.

PLL 400 includes wire delay 404, input path circuitry 405, and PLL core and counter circuits 406. Input path circuitry 405 includes multiplexer 101, counter 103, delay circuit 104, and possibly other circuit elements. PLL core and counter circuits 406 include circuit elements 105-112, 114, 116, and block 118. PLL 400 also includes input mimic path circuitry 407, delta T delay circuit 408, and multiplexer 409, which function as described above with respect to circuit elements 206-208.

C1 counter circuit 118A in block 118 generates periodic (clock) output signal PLOUT1, and M counter circuit 111 generates periodic (clock) output signal PLOUT2. Periodic output signal PLOUT1 is transmitted to registers in several logic elements and input/output elements on the PLD through PLD clock network 416. Register 414 represents the logic element register or input/output element register on the PLD that is farthest away from PLL 400. Thus, the path between PLL 400 and register 414 through PLD clock network 416 contains the maximum delay that PLOUT1 receives in network 416.

The periodic output signal PLOUT2 of M counter 111 is routed through a mimic PLD clock network 417 to wire delay 415. Mimic PLD clock network 417 is a mimic path that mimics the maximum delay of PLD clock network 416. Mimic PLD clock network 417 introduces the same or approximately the same delay into PLOUT2 that PLD clock network 416 introduces into PLOUT1 between PLL 400 and register 414. For example, mimic PLD clock network 417 can have the same (or substantially the same) length of wire and the same (or substantially the same) number and type of programmable logic connections as PLD clock network 416.

Clock routing networks 416 and 417 are shown as boxes in FIG. 4 to simplify the drawing. However, routing networks 416 and 417 typically include several wires and several programmable logic connectors (e.g., multiplexers) that can introduce a significant amount of delay into clock signals PLOUT1 and PLOUT2. Mimic routing network 417 is routed parallel to routing network 416 through the same portions of the chip.

Output signal PLOUT2 is routed through mimic clock network 417, wire delay 415, input mimic path circuitry 407, delta T delay circuit 408, multiplexer 409, and multiplexer 114 to the second input of PFD 105 as feedback clock signal FCLK. By placing mimic PLD clock network 417 in the feedback loop of PLL 400, network 417 compensates for the delay of PLD clock network 416. Network 417 causes the edges of PLOUT2 to occur earlier in time by the delay in network 417.

Wire delay 404 represents the wire delay in the input reference clock path within PLL 400, as shown in FIG. 4, and/or outside PLL 400. The delay of wire delay 415 has the same or approximately the same delay that wire delay 404 introduces into the input reference clock signal RCLK of PLL 400. For example, the delay of wire delay 415 has the same or approximately the same length of wire and programmable logic connectors that are in wire delay 404. Thus, wire delay 415 compensates for the delay of wire delay 404, or wire delay 404 compensates for the delay of wire delay 415.

Multiplexer 409 is programmed to couple the output of delta T delay circuit 408 to an input of multiplexer 114. In normal mode, multiplexer 114 is programmed to transmit the output signal of multiplexer 409 to the second input of PFD 105 as feedback clock FCLK.

Mimic PLD clock network 417, wire delay 415, input mimic path circuitry 407, and delta T delay circuit 408 are coupled into the feedback loop of PLL 400 to cause the edges of output clock signal PLOUT1 as received at register 414 to occur at the same time as corresponding edges of input clock signal CLKIN at input pin 401. Thus, in normal mode, the compensation circuitry coupled into the feedback loop of PLL 400 generates zero delay between CLKIN at pin 401 and clock output signal PLOUT1 as received at register 414. As a result, the compensation circuitry of FIG. 4 causes clock output signal PLOUT1 as received at register 414 to have the same phase and timing as CLKIN at pin 401.

Figure 5:
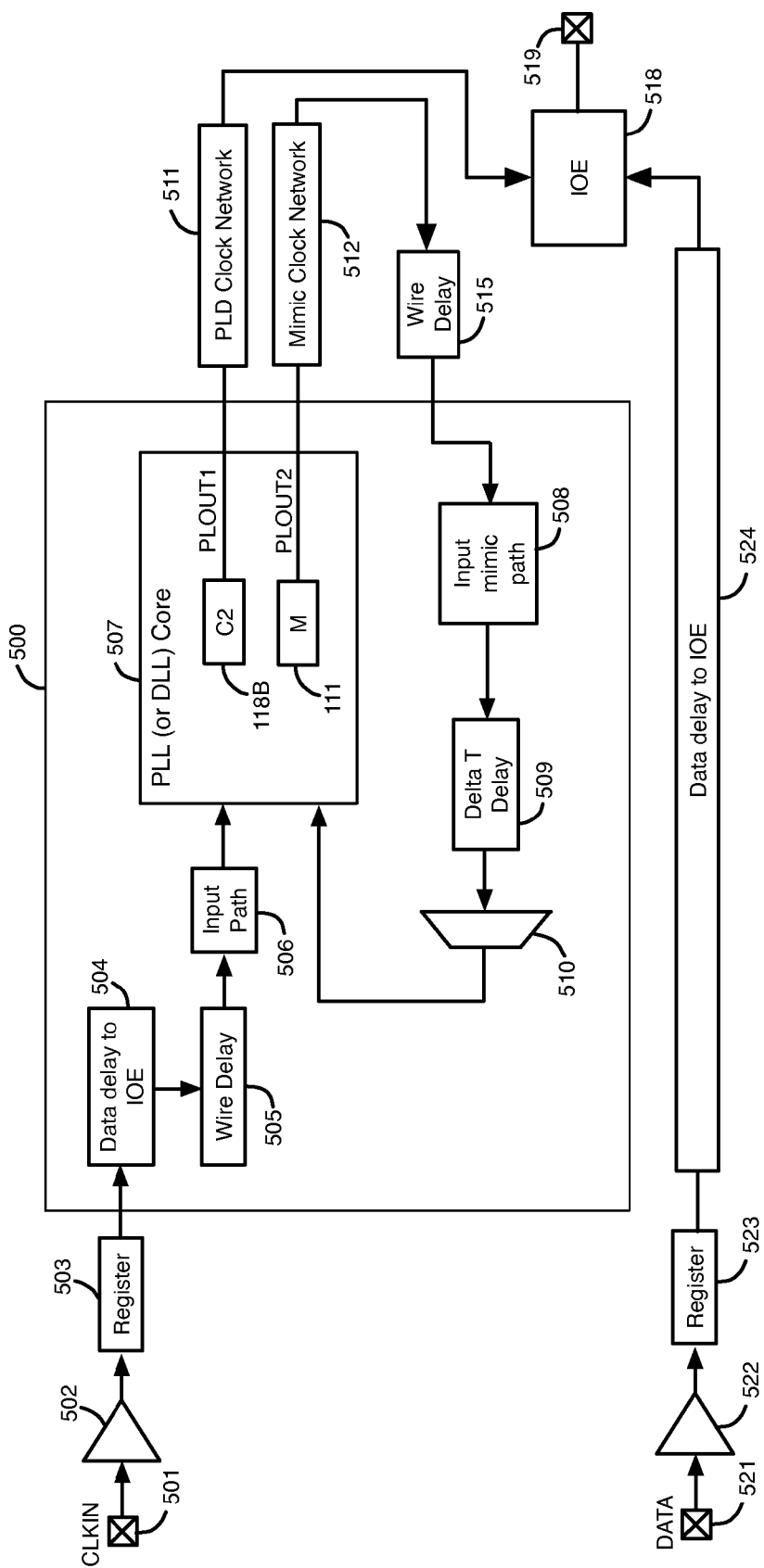
FIG. 5 illustrates circuitry that maintains at an input/output (I/O) element or I/O register a phase and timing relationship that exists between a clock signal and a data signal at input pins, according to an embodiment of the present invention.

FIG. 5 illustrates circuitry that maintains at an input/output (IO) element or IO register the same timing and phase relationship that exists between an input clock signal and an input data signal at input pins, according to an embodiment of the present invention. The circuitry of FIG. 5 generates a mode of operation that is referred to as source synchronous mode.

PLL 500 is located on a programmable logic device (PLD) integrated circuit. The PLD receives an input clock signal CLKIN at an input clock pin 501. Input buffer 502 drives clock signal CLKIN to PLL 500 through IO register 503. CLKIN is routed from register 503 through data delay to IOE 504, wire delay 505, and input path circuitry 506 to a first input of PFD 105 in PLL core 507 as reference clock signal RCLK. PLL 500 includes PLL core circuitry 507 that generates multiple clock output signals, including periodic output signals PLOUT1 and PLOUT2. PLOUT1 is generated by C2 counter circuit 118B, and PLOUT2 is generated by M counter circuit 111. PLOUT1 is routed through PLD clock routing network 511 to a register in an input/output element (IOE) 518, which is coupled to pin 519.

PLOUT2 is routed through mimic PLD clock routing network 512, wire delay 515, input mimic path 508, delta T delay circuit 509, and multiplexer 510. Mimic PLD clock network 512 mimics the maximum delay of PLD clock network 511, as described above with respect to FIG. 4. Wire delay 515 compensates for wire delay 505, as described above in FIG. 4. Input mimic path circuit 508 compensates for the delay of input path circuitry 506, as described above with respect to FIG. 2. Delta T delay circuit 509 compensates for other delays as described above with respect to FIG. 2.

A data signal DATA is driven to the PLD at input data pin 521. Input buffer 522 drives the data signal DATA from input pin 521 to IO register 523. The data signal DATA is then transmitted from IO register 523 to a register in input/output element (IOE) 518. Between register 523 and IOE 518, the data signal DATA is transmitted through a routing network and/or circuit elements 524. The routing network and circuit elements 524 introduce a delay into the data signal DATA between register 523 and IOE 518.

Input clock signal CLKIN and data signal DATA have a particular phase and timing relationship at input pins 501 and 521, respectively. The delay of input buffer 522 matches the delay of input buffer 502. However, data delay to IOE wires and circuits 524 can cause clock signal PLOUT1 and the data signal to not have the same phase and timing relationship that CLKIN and DATA have at pins 501 and 521.

In order to maintain the same phase and timing relationship at IOE 518 that exists between the clock and data signals at pins 501 and 521, data delay to IOE wires and circuit elements 504 are added into the input reference clock path of PLL 500 before PFD 105, as shown in FIG. 5. In the example of FIG. 5, data delay to IOE wires and circuit elements 504 are coupled between register 503 and wire delay 505.

Data delay to IOE 504 can have a programmable or fixed delay. Alternatively, circuitry 504 can have a programmable delay component and a fixed delay component. Data delay to IOE 504 can, for example, have the same length of wire and the same circuit elements that are in data delay to IOE 524. Alternatively, data delay to IOE 504 has a set of delay circuits that can be set to have the same or approximately the same delay as data delay to IOE 524.

The delay of data delay to IOE 504 causes PLL 500 to delay PLOUT1 and PLOUT2 by the same amount of delay that data delay to IOE 524 adds to the data signal. As a result, the data signal and the clock signal PLOUT1 have the same phase and timing relationship at IOE 518 that CLKIN and DATA have at input pins 501 and 521, respectively.

Figure 6:
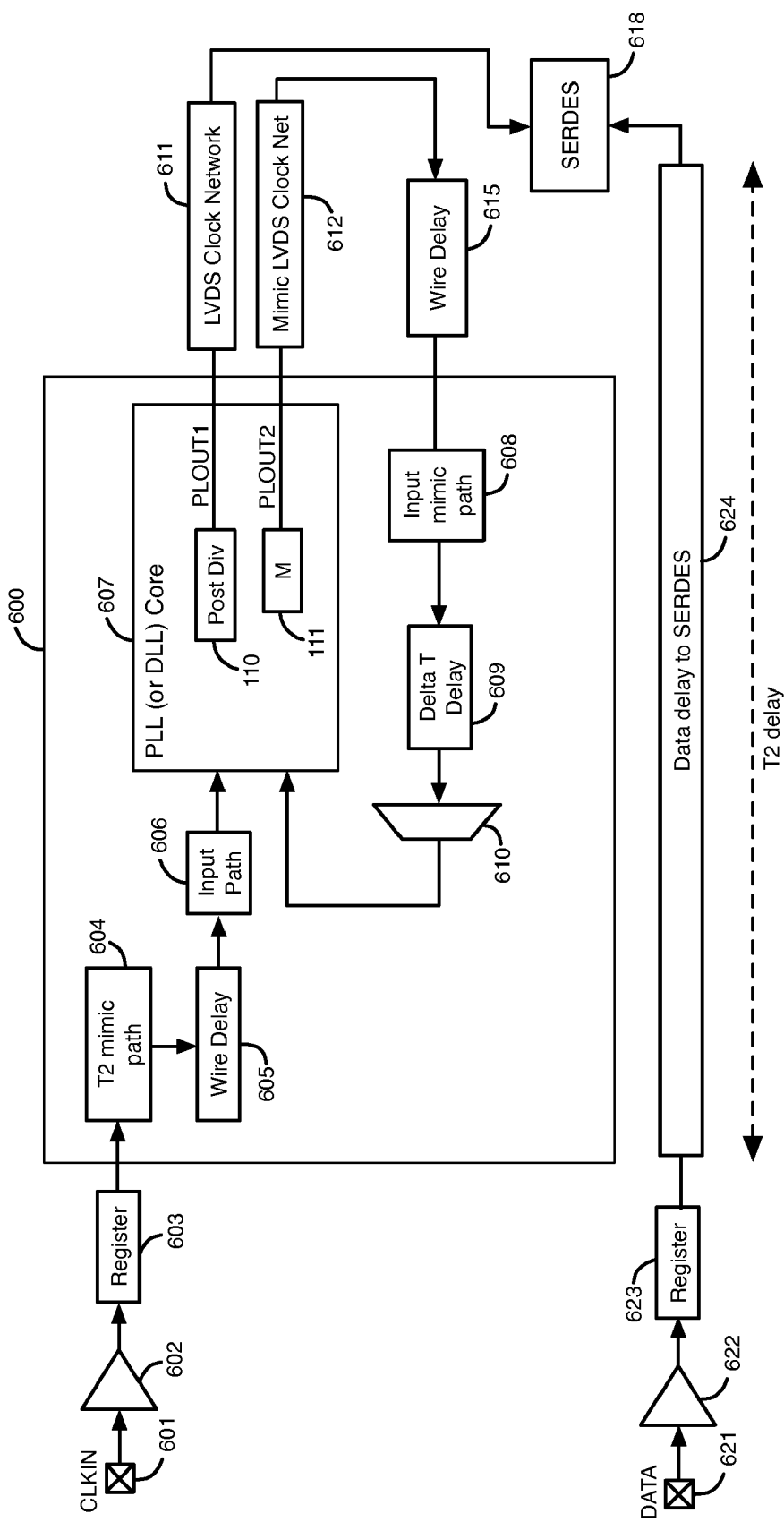
FIG. 6 illustrates circuitry that maintains at a SERDES capture register a phase and timing relationship that exists between a clock signal and a data signal at input pins, according to an embodiment of the present invention.

FIG. 6 illustrates circuitry that maintains at a SERDES capture register the phase and timing relationship that exists between an input clock signal and an input data signal at input pins, according to an embodiment of the present invention. The circuitry of FIG. 6 generates a mode of operation that is referred to as a low voltage differential signaling (LVDS) compensation mode.

PLL 600 is located on a programmable logic device (PLD) integrated circuit. The PLD receives an input clock signal CLKIN at an input clock pin 601. Input buffer 602 drives clock signal CLKIN to PLL 600 through register 603. CLKIN is routed from register 603 through T2 mimic path 604, wire delay 605, and input path circuitry 606 to a first input of PFD 105 in PLL core 607 as reference clock signal RCLK.

PLL core circuitry 607 generates multiple clock output signals, including periodic output signals PLOUT1 and PLOUT2. PLOUT1 is generated by VCO post divider 110, and PLOUT2 is generated by M counter circuit 111. PLOUT1 is routed through an LVDS clock network 611 to a SERDES capture register 618. SERDES is a soft IP transceiver that serially transmits and receives data and that has a number of data channels.

PLOUT2 is routed through mimic LVDS clock network 612, wire delay 615, input mimic path 608, delta T delay circuit 609, and multiplexer 610. Mimic LVDS clock network 612 mimics the delay of LVDS clock network 611, as described above with respect to mimic PLD clock network 417. Wire delay 615 compensates for wire delay 605, as described with respect to wire delay 415. Input mimic path circuit 608 compensates for the delay of input path circuitry 606, as described above with respect to FIG. 2. Delta T circuit 609 compensates for other delays, as described above.

A data signal DATA is driven to the PLD at input data pin 621. Input buffer 622 drives the data signal DATA from input pin 621 to IO register 623. The data signal DATA is then transmitted from register 623 to SERDES capture register 618 through a routing network and/or circuit elements 624. The routing network and circuit elements 624 introduce a delay T2 into the data signal between register 623 and SERDES capture register 618.

Input clock signal CLKIN and data signal DATA have a particular phase and timing relationship at input pins 601 and 621, respectively. The delay of input buffer 622 matches the delay of input buffer 602. However, the data delay to SERDES wires and circuits 624 can cause clock signal PLOUT1 and the data signal that are received at register 618 to have a different phase and timing relationship than CLKIN and DATA have at pins 601 and 621.

In order to maintain the same phase and timing relationship at SERDES capture register 618 that exists between the clock and data signals at pins 601 and 621, T2 mimic path circuitry 604 is added into the input reference clock path of PLL 600 before PFD 105, as shown in FIG. 6. In the example of FIG. 6, T2 mimic path circuitry 604 is coupled between register 603 and wire delay 605. The delay of T2 mimic path circuitry 604 can be programmable or fixed. Alternatively, circuitry 604 can have a programmable delay component and a fixed delay component.

The delay of T2 mimic path circuitry 604 can be set to cause PLL 600 to delay PLOUT1 and PLOUT2 by the same amount of delay T2 that data delay to SERDES path 624 adds to the data signal. T2 mimic path circuitry 604 can, for example, have the same length of wire and the same circuit elements that are in data delay to SERDES path 624. Alternatively, T2 mimic path 604 can have a set of delay circuits that can be programmed to have the same or approximately the same delay as data delay to SERDES path 624. As a result, PLOUT1 and DATA have the same phase and timing relationship at SERDES register 618 that CLKIN and DATA have at input pins 601 and 621, respectively.

Figure 7:
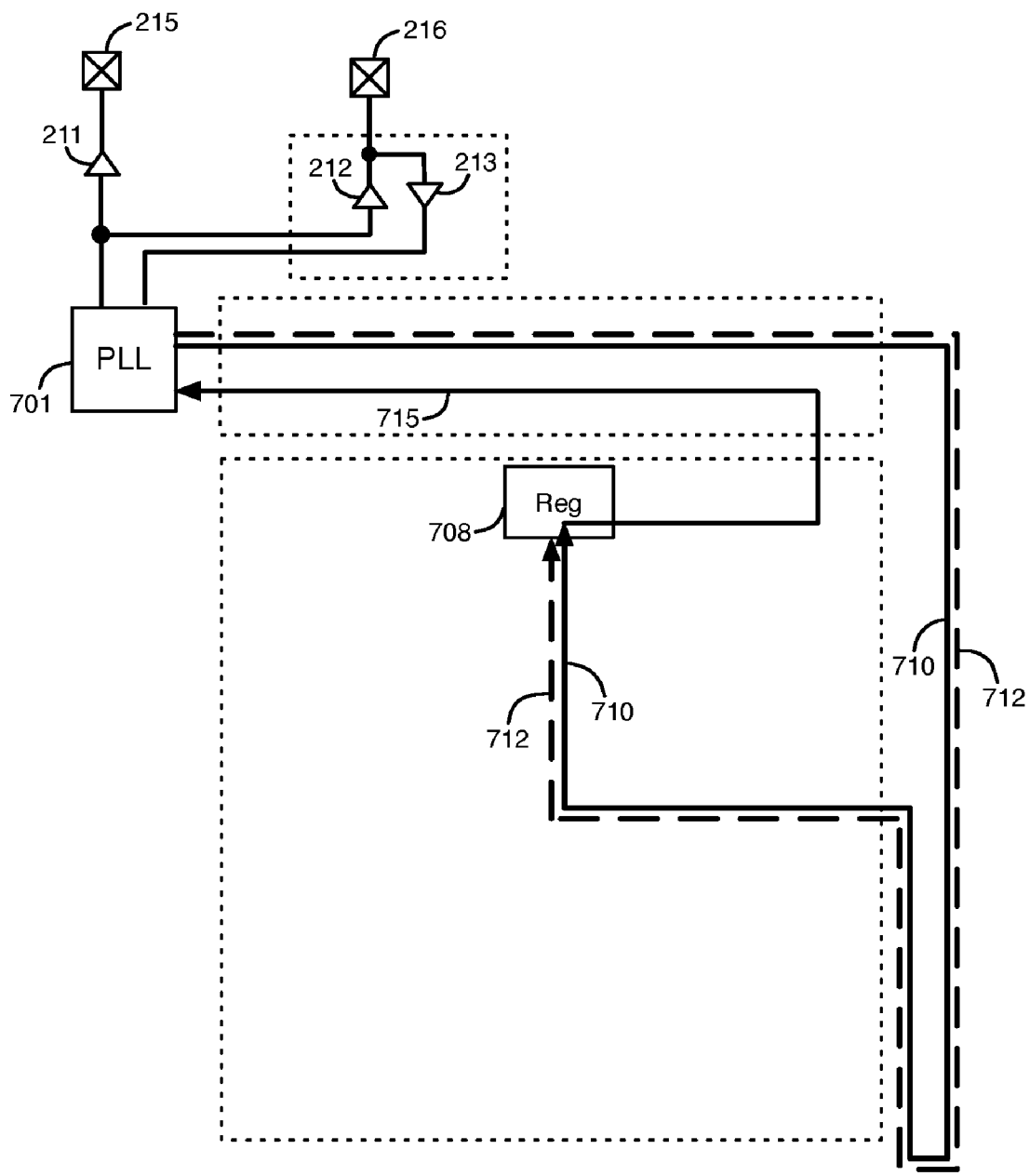
FIG. 7 illustrates examples of mimic routing networks on an integrated circuit, according to various embodiments of the present invention.

FIG. 7 illustrates examples of mimic routing networks on an integrated circuit 700, according to various embodiments of the present invention. Programmable logic integrated circuit (IC) 700 includes a phase-locked loop (PLL) 701. IC 700 is a FPGA/PLD. IC 700 can be configured to couple output buffer 212 and input buffer 213 into the feedback path of PLL 701, as described above with respect to FIG. 2. Output buffer 211 drives an output clock signal of PLL 701 to output pin 215.

An output clock signal of PLL 701 is transmitted to a register 708 (e.g., in a logic element or input/output element) on the IC through PLD clock routing network 712. Register 708 represents the logic element register or input/output element register on the IC that is farthest away from PLL 701. Thus, the path between PLL 701 and register 708 through network 712 contains the maximum delay that the output clock signal receives in network 712.

IC 700 can also be configured to couple mimic PLD clock routing network 710 into the feedback loop of PLL 701, as described above with respect to FIGS. 4-5. Mimic PLD clock routing network 710 is an example of mimic PLD clock networks 417 and 512. Mimic PLD clock routing network 710 routes a feedback clock signal of PLL 701 to register 708. Mimic PLD clock routing network 710 is routed parallel to PLD clock network 712 through the same portions of the IC so that the delay of network 710 mimics the delay of network 712.

The feedback clock signal is routed through network 710 to register 708 and then through routing network 715 to a feedback loop in PLL 701 (e.g., to input mimic path circuitry 407). Network 715 adds an extra delay into the feedback clock signal relative to the delay of the clock signal routed through network 712. The extra delay of network 715 can be compensated for by adding a matching delay into the input reference clock path of PLL 701, for example, by increasing the delay of delay circuit 104. Alternatively, network 715 can be an example of wire delay 415 in FIG. 4.

Because PLL 100 contains multiple output counter circuits in block 118, PLL 100 is versatile enough to be programmed to enter any of the clock compensation modes described herein.

Figure 8:
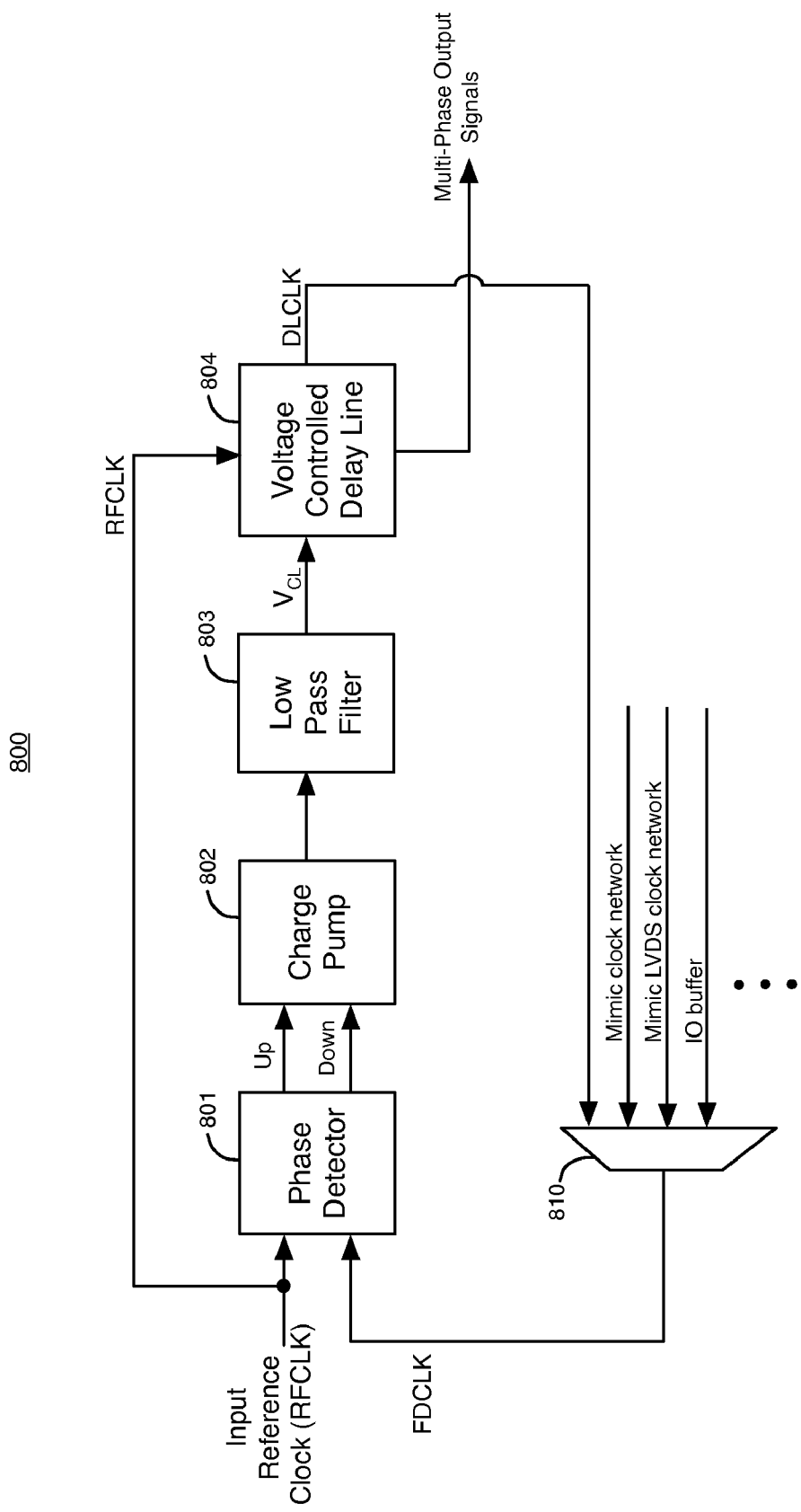
FIG. 8 illustrates a delay-locked loop that can generate a compensated output clock signal, according to an embodiment of the present invention.

FIG. 8 illustrates a delay locked loop (DLL) 800 that can generate a compensated output clock signal, according to an embodiment of the present invention. DLL 800 is merely one example of a DLL that can include embodiments of the present invention. It should be understood that embodiments of the present invention can be used with DLLs having numerous other configurations.

Delay locked loop 800 includes a phase detector 801, a charge pump 802, a low pass filter 803, a voltage-controlled delay line 804, and a multiplexer 810. Phase detector 801 compares an input reference clock signal RFCLK to a feedback clock signal FDCLK that has the same frequency. Because the frequencies of RFCLK and FDCLK are already locked, phase detector 801 compares the phases of these two signals.

Phase detector 801 generates Up and Down error signals that are indicative of the difference between the phases of RFCLK and FDCLK. The Up and Down error signals are transmitted to charge pump 802. Charge pump 802 and low pass filter 803 convert the Up and Down error signals into a control voltage $V_{CL}$.

Voltage-controlled delay line (VCDL) 804 includes a set of delay circuits. The delay circuits delay the reference clock signal RFCLK to generate a periodic delay signal DLCLK and a set of periodic output signals that have multiple phases. The control voltage $V_{CL}$ controls the delay of the delay circuits in voltage-controlled delay line 804.

Multiplexer 810 can be programmed to transmit delay signal DLCLK to the second input of phase detector 801 as the feedback signal FDCLK. Alternatively, multiplexer 810 can be programmed to select a compensated clock signal as the feedback signal FDCLK according to any of the embodiments of the present invention. For example, multiplexer 810 can be programmed to select a signal from a feedback compensation path that compensates for the delay of a PLD clock network, a LVDS clock network, an input buffer, an output buffer, board trace delay, etc. Circuitry can also be added to DLL 800 in the input reference clock path to delay RFCLK before it is transmitted to phase detector 801 to compensate for the data delay to an IOE or SERDES register, as described above. DLL 800 can be substituted for any of PLL core circuits 205, 406, 507, and 607. DLL 800 can also include counter circuits (not shown) in the input reference and feedback paths.

Figure 9:
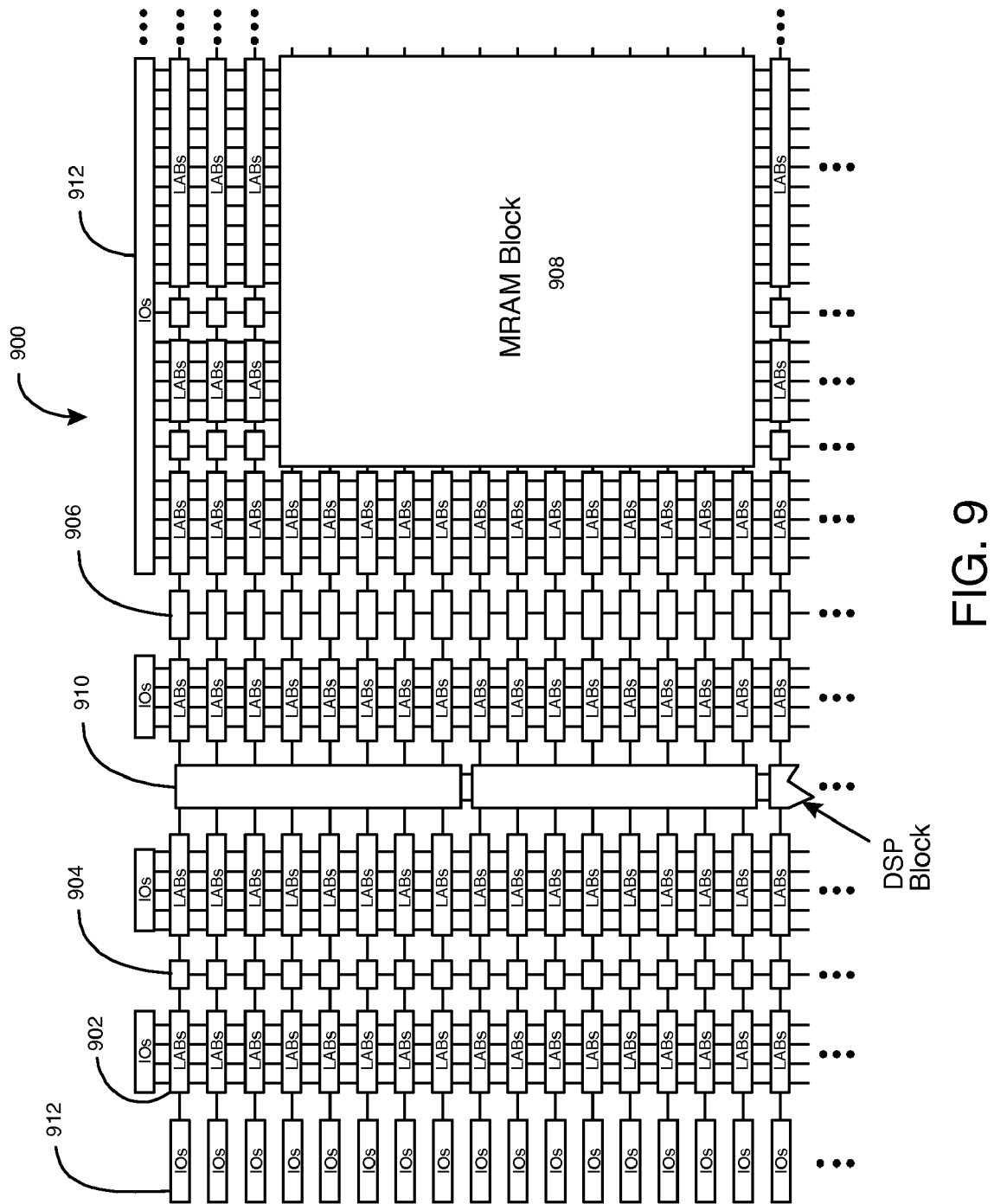
FIG. 9 is a simplified block diagram of a field programmable gate array (FPGA) that can embody the techniques of the present invention.

FIG. 9 is a simplified partial block diagram of a PLD/FPGA 900 that can include aspects of the present invention. FPGA 900 is merely one example of an integrated circuit that can include features of the present invention. It should be understood that embodiments of the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including RAM blocks of varying sizes provided throughout the array. The RAM blocks include, for example, blocks 904, blocks 906, and block 908. These memory blocks can also include shift registers and FIFO buffers.

FPGA 900 further includes digital signal processing (DSP) blocks 910 that can implement, for example, multipliers with add or subtract features. IO blocks (IOs) 912 located, in this example, around the periphery of the chip support numerous single-ended and differential input/output standards. The IO blocks 912 contain IO buffers and are typically grouped into IO banks. It is to be understood that FPGA 900 is described herein for illustrative purposes only and that the present invention can be implemented in many different types of PLDs, FPGAs, and the like.

Figure 10:
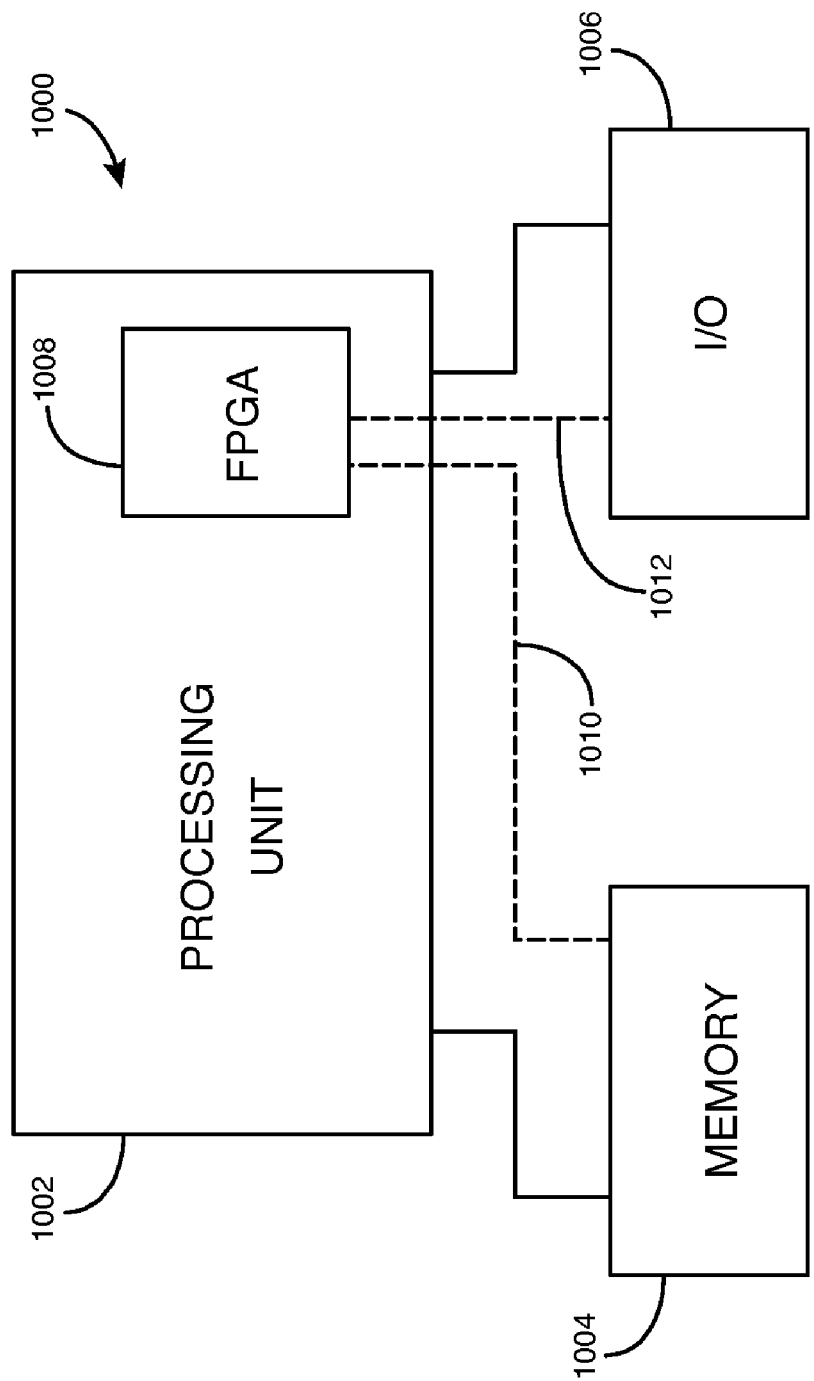
FIG. 10 is a block diagram of an electronic system that can implement embodiments of the present invention.

The present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004 and an I/O unit 1006 interconnected together by one or more buses. According to this exemplary embodiment, an FPGA 1008 is embedded in processing unit 1002. FPGA 1008 can serve many different purposes within the system in FIG. 10. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004 or receive and transmit data via I/O unit 1006, or other similar function. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor, which can be reprogrammed as needed to handle a particular computing task. Alternately, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. A circuit comprising:
a first input buffer that receives a reference clock signal;
a locked circuit that receives the reference clock signal from the first input buffer, wherein the locked circuit comprises a phase detector that compares the reference clock signal and a feedback signal from a feedback loop;
a second input buffer that drives a periodic output signal of the locked circuit to generate the feedback signal, wherein a delay of the second input buffer compensates for a delay that the first input buffer introduces into the reference clock signal, and
a delay circuit in the feedback loop that compensates for a difference between the delay of the first input buffer and the delay of the second input buffer.

2. The circuit defined in claim 1 wherein the locked circuit is a phase-locked loop circuit.

3. The circuit defined in claim 1 wherein the locked circuit is a delay-locked loop circuit.

4. The circuit defined in claim 1 further comprising:
a first output buffer that drives the periodic output signal of the locked circuit to a pin; and
a second output buffer in the feedback loop that drives the periodic output signal of the locked circuit to an input of the second input buffer, wherein a delay of the second output buffer is substantially equal to a delay of the first output buffer.

5. The circuit defined in claim 1 wherein the second input buffer contains substantially the same circuit architecture as the first input buffer.

6. A circuit comprising:
a first input buffer that receives a reference clock signal;
a locked circuit that receives the reference clock signal from the first input buffer, wherein the locked circuit comprises a phase detector that compares the reference clock signal and a feedback signal from a feedback loop; and a second input buffer that drives a periodic output signal of the locked circuit to generate the feedback signal, wherein a delay of the second input buffer compensates for a delay that the first input buffer introduces into the reference clock signal, and wherein the locked circuit further comprises input path circuitry that receives the reference clock signal from the first input buffer and transmits the reference clock signal to an input of the phase detector, and the feedback loop comprises input mimic path circuitry that compensates for a delay of the input path circuitry.

7. The circuit defined in claim 6 wherein the locked circuit is a phase-locked loop circuit.

8. The circuit defined in claim 6 further comprising:
a first output buffer that drives the periodic output signal of the locked circuit; and
a second output buffer that drives the periodic output signal of the locked circuit through the feedback loop, wherein a delay of the second output buffer compensates for a delay of the first output buffer.

9. A circuit comprising:
a locked circuit comprising a phase detector that compares phases of a reference clock signal and a feedback signal received from a feedback loop;
a first output buffer that drives a periodic output signal of the locked circuit; and
a second output buffer that drives a periodic output signal of the locked circuit through the feedback loop, wherein a delay of the second output buffer compensates for a delay of the first output buffer; and
a delay circuit in the feedback loop that compensates for a difference between the delay of the first output buffer and the delay of the second output buffer.

10. The circuit defined in claim 9 wherein the locked circuit is a phase-locked loop circuit.

11. The circuit defined in claim 9 wherein the locked circuit is a delay-locked loop circuit.

12. A circuit comprising:
a locked circuit that generates periodic output signals in response to a reference clock signal and a feedback signal that are received at a phase detector;
a first clock network that transmits a periodic output signal from the locked circuit to a circuit element on the circuit; and
a feedback loop coupled to the locked circuit that comprises a mimic clock network, wherein the feedback loop generates the feedback signal in response to a periodic output signal from the locked circuit, and the mimic clock network is routed parallel to the first clock network through the same portions of the circuit.

13. The circuit defined in claim 12 further comprising:
an input buffer that transmits the reference clock signal to an input of the phase detector,
wherein the feedback loop causes the periodic output signal received at the circuit element to have the same phase as the reference clock signal as received at an input of the input buffer.

14. The circuit defined in claim 12 wherein the locked circuit is a phase-locked loop.

15. The circuit defined in claim 12 wherein the locked circuit is a delay-locked loop.

16. The circuit defined in claim 12 wherein the circuit element is a register in at least one of a programmable logic element and an input/output element.

17. The circuit defined in claim 12 wherein the first clock network comprises first programmable logic connections, the mimic clock network comprises second programmable logic connections, the first clock network provides a first delay to a periodic output signal of the locked circuit, and the mimic clock network provides a second delay to a periodic output signal of the locked circuit that compensates for the first delay of the first clock network.

18. The circuit defined in claim 12 wherein the circuit is a field programmable gate array, and wherein the first clock network and the mimic clock network have substantially the same number of programmable logic connections and substantially the same length of wire.

19. A circuit comprising:
a first input buffer that receives a reference clock signal;
a data routing network comprising circuits;
a second input buffer that drives a data signal to a circuit element on the circuit through the data routing network, wherein the second input buffer and the data routing network comprise separate circuits;
a locked circuit that receives the reference clock signal, wherein the locked circuit comprises a phase detector that compares phases of the reference clock signal and a feedback signal; and
delay circuitry coupled in an input reference path of the locked circuit that delays the reference clock signal to compensate for a delay of the data routing network, wherein the delay circuitry and the first input buffer comprise separate circuits.

20. The circuit defined in claim 19 wherein the circuit element is an input/output element.

21. The circuit defined in claim 19 wherein the delay circuitry is configured to cause a phase relationship between a periodic output signal of the locked circuit as received at the circuit element and the data signal as received at the circuit element to be equivalent to a phase relationship between the reference clock signal at an input of the first input buffer and the data signal at an input of the second input buffer.

22. The circuit defined in claim 19 wherein the locked circuit is a phase-locked loop circuit.

23. The circuit defined in claim 19 wherein the locked circuit is a delay-locked loop circuit.

* * * * *